United States Patent [19]

Morgan

[11] Patent Number: 5,796,300

[45] Date of Patent: Aug. 18, 1998

[54] SWITCHED-CAPACITOR AMPLIFIER OFFSET VOLTAGE COMPENSATION CIRCUIT

[75] Inventor: Wayne A. Morgan, Northridge, Calif.

[73] Assignee: Pacesetter, Inc., Sylmar, Calif.

[21] Appl. No.: 601,629

[22] Filed: Feb. 14, 1996

[51] Int. Cl.$^6$ .................. H03F 1/34; H03M 1/34
[52] U.S. Cl. .................. 330/9; 330/51; 341/165
[58] Field of Search .................. 330/9, 51; 341/150, 341/153, 164, 165; 327/65, 67, 307, 337, 554

[56] References Cited

U.S. PATENT DOCUMENTS

| | | |
|---|---|---|
| 4,163,947 | 8/1979 | Weedon .................. 327/307 X |
| 4,210,872 | 7/1980 | Gregorian . | |
| 4,393,351 | 7/1983 | Gregorian et al. . | |
| 4,543,534 | 9/1985 | Temes et al. . | |

Primary Examiner—James B. Mullins

[57] ABSTRACT

Circuitry for reducing charge injection effects in an offset voltage compensation circuit for a switched-capacitor amplifier is provided. The switched-capacitor amplifier circuitry includes an operational amplifier having inverting and noninverting inputs and an output. An initialization circuit provides the inverting input with a voltage close to the offset voltage of the operational amplifier. A feedback circuit ensures that the voltage at the inverting input attains the offset voltage. In order to attenuate the effects of disengaging the feedback circuit after the input voltage attains the offset voltage, an attenuation circuit is provided. The attenuation circuit prevents the voltage at the inverting input from being affected by charge injection effects that arise when the feedback circuit is disengaged. The offset voltage compensation circuit may be used with switched-capacitor amplifiers configured as comparators, amplifiers, or successive approximation A/D converters.

33 Claims, 5 Drawing Sheets

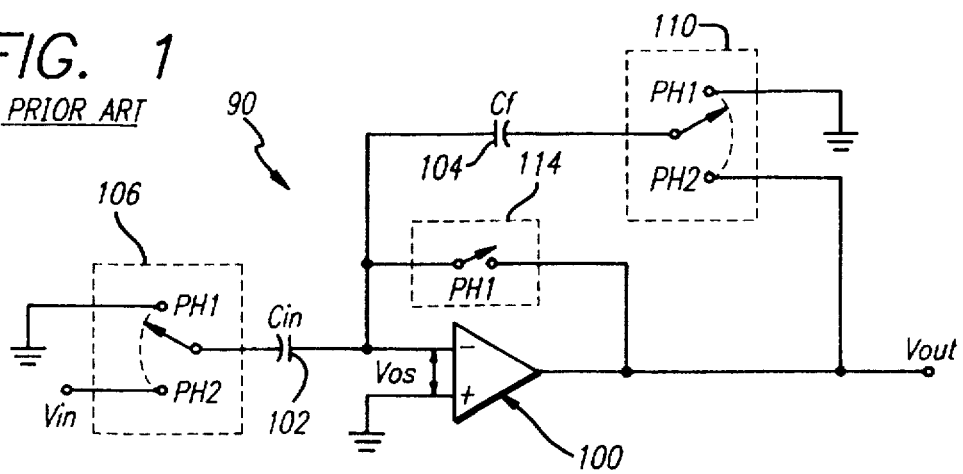
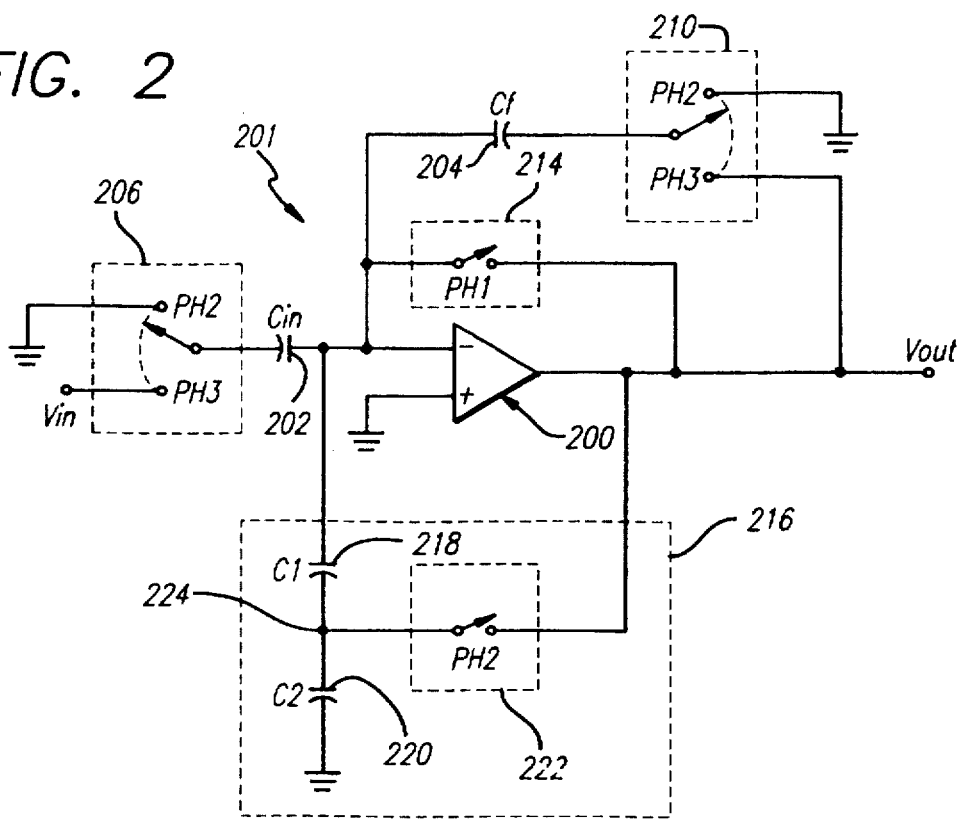
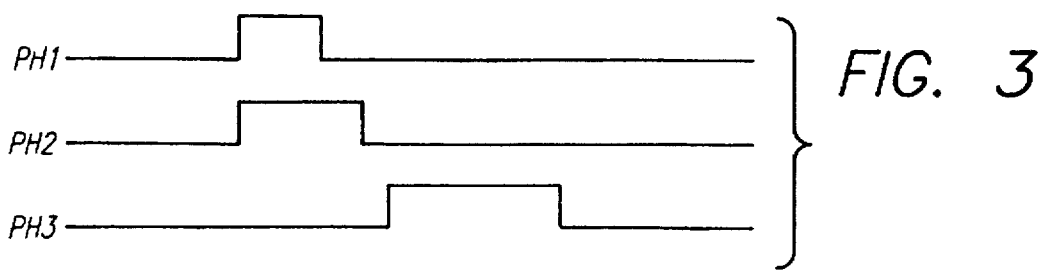

SWITCHED-CAPACITOR AMPLIFIER OFFSET VOLTAGE COMPENSATION CIRCUIT

FIELD OF THE INVENTION

The field of the invention relates to switched-capacitor amplifiers, and more particularly to circuitry for compensating for offset voltages in switched-capacitor amplifiers.

BACKGROUND OF THE INVENTION

Switched-capacitor amplifiers are widely used in metal oxide semiconductor (MOS) integrated circuits, for example, as amplifiers or comparators in analog-to-digital or digital-to-analog converters. Typically these integrated circuits are used in low-power systems. The input and feedback portions of such switched-capacitor amplifiers are formed using capacitors rather than resistors. Because integrated capacitors are generally smaller than integrated resistors, switched-capacitor amplifiers can be fabricated more compactly than amplifier circuits based on resistors. Further, the gain of switched-capacitor amplifiers is determined by the ratio of the integrated capacitors used in the input and feedback portions of the amplifier circuit. Because the integrated capacitors can be manufactured to high tolerances, switched-capacitor amplifiers can be fabricated with accurate gains.

However, conventional switched-capacitor amplifiers exhibit a number of nonideal characteristics. One such characteristic is the offset voltage inherent in the operational amplifier used to form the switched-capacitor amplifier circuit. The offset voltage is the voltage that is required at the input of an operational amplifier to produce a zero level output. The offset voltage behavior of the operational amplifier adversely effects the ability of the amplifier to linearly amplify a given input voltage. Offset voltage compensation circuits based on field-effect transistor (FET) switches have been developed, but conventional offset voltage compensation circuits have injected an undesirable charge into the input portion of the switched-capacitor amplifier circuit, which has caused conventional switched-capacitor amplifier circuits to exhibit further nonideal characteristics.

The charge injection effect can be reduced somewhat by increasing the value of the capacitor used in the feedback portion of the amplifier circuit. However, increasing the feedback capacitance requires an accompanying increase in the input capacitance to maintain the desired amplifier gain. Increasing both the input and feedback capacitances is undesirable, because larger capacitances consume more area on the integrated circuit.

It would therefore be desirable to be able to compensate for the switched-capacitor amplifier offset voltage without introducing further nonideal amplifier characteristics due to charge injection.

SUMMARY OF THE INVENTION

To overcome the disadvantages of the prior art, the present invention provides circuitry for compensating for the offset voltage of a switched-capacitor amplifier while reducing charge injection effects.

In one embodiment, the circuitry includes an operational amplifier and a first switching circuit for selectively coupling the output of the operational amplifier to the inverting input of the operational amplifier. A charge injection reduction circuit includes a feedback attenuation circuit, coupled to the inverting input, for attenuating charge injection effects at the inverting input. A second switching circuit selectively couples the feedback attenuation circuit to the operational amplifier output.

The first and second switching circuits are controlled by a clock signal having a first phase, and further having a second phase that begins with the beginning of the first phase, overlaps a portion of the first phase, and ends after the first phase ends. The first switching circuit couples the operational amplifier output to the inverting input during the first phase to initialize the inverting input to the offset voltage. The first switching circuit uncouples the operational amplifier from the inverting input at the end of the first phase, thereby causing charge injection effects. The second switching circuit couples the feedback attenuation circuit to the operational amplifier output during the second phase to eliminate the charge injection effects of the first switching circuit. When the second switching circuit uncouples the feedback attenuation circuit from the operational amplifier output at the end of the second phase, additional charge injection effects arise. However, the feedback attenuation circuit attenuates the charge injection effects.

The feedback attenuation circuit preferably includes a first capacitor having a first plate and a second plate. The first plate is coupled to the inverting input of the operational amplifier. A second capacitor also has a first plate and a second plate, wherein the first plate is coupled at a node to the second plate of the first capacitor. The second plate of the second capacitor is coupled to a first voltage, preferably ground. The second switching circuit couples the node to the output of the operational amplifier during the second phase, and uncouples the node from the output at the end of the second phase.

In another embodiment, the offset voltage of a switched-capacitor amplifier is compensated by providing a first feedback switch that connects the output of the amplifier to the inverting input of an operational amplifier. The first feedback switch allows the inverting input terminal to attain the offset voltage of the amplifier. When the first feedback switch opens, however, a charge is injected onto the inverting input node, which causes the voltage on the inverting input node to change from the desired value (equal to the offset voltage). The switched-capacitor amplifier circuitry of this embodiment therefore also has a second feedback path provided by a second switch.

When the second switch is closed, the second feedback path is established between the output of the operational amplifier and its inverting input, which allows the inverting input to attain the offset voltage. A feedback attenuation circuit is also provided, so that the second feedback path may be broken by opening the second switch, without affecting the voltage at the inverting input due to charge injection from the second switch.

Yet another switched-capacitor amplifier circuitry embodiment uses a first switch to connect a separate voltage source to the inverting input of an operational amplifier to raise the inverting input of the amplifier to a voltage close to the value necessary to maintain the offset voltage across the input terminals of the amplifier. A second switch is used to provide a feedback path between the output of the operational amplifier and the inverting input. After the inverting input attains the voltage required to establish the offset voltage across the input terminals of the operational amplifier, the second switch opens to disconnect the second feedback path. The opening of the second switch injects a charge, but that charge does not affect the voltage at the inverting input node of the operational amplifier, because the

3 voltage induced on the inverting input by the injected charge is attenuated by a feedback attenuation circuit.

BRIEF DESCRIPTION OF THE DRAWINGS

The objects, features and advantages of the present invention will be apparent to one skilled in the art in light of the following detailed description in which:

FIG. 1 illustrates a switched-capacitor amplifier circuit with conventional offset voltage compensation circuitry;

FIG. 2 illustrates a switched-capacitor amplifier incorporating the offset voltage compensation circuitry of the present invention;

FIG. 3 illustrates a timing diagram of a three-phase clock signal suitable for use with the circuitry of FIG. 2;

DETAILED DESCRIPTION OF THE INVENTION

Figure 4:
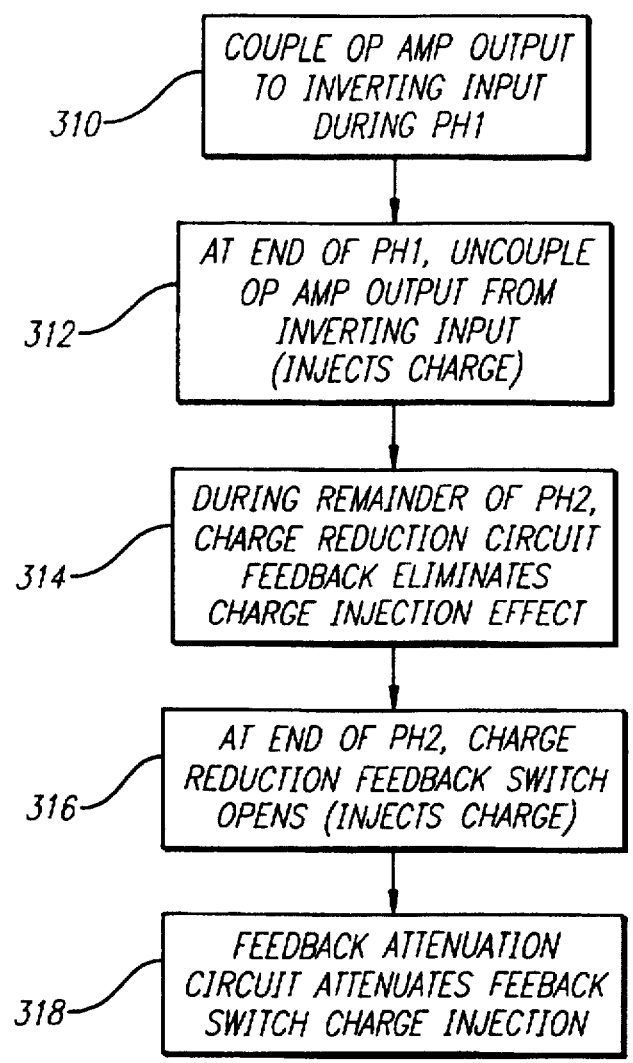
FIG. 4 is a flowchart illustrating the process of the present invention for offset voltage compensation with reduced charge injection.

The present invention provides circuitry for reducing charge injection effects in an offset voltage compensation circuit for a switched-capacitor amplifier. For purposes of explanation, specific details are set forth to provide a thorough understanding of the present invention. However, it will be understood by those skilled in the art, from reading this disclosure, that the invention may be practiced without these details. Moreover, well-known elements, devices, process steps and the like are not set forth in order to avoid obscuring the invention.

A switched-capacitor amplifier having conventional offset voltage compensation circuitry is shown in FIG. 1. Amplifier circuitry 90 includes an operational amplifier 100, an input capacitor $C_{in}$ 102 and a feedback capacitor $C_f$ 104.

The amplifier circuitry 90 is clocked by a two phase nonoverlapping clock signal. During the first phase ($\phi_1$), the amplifier circuitry 90 is initialized. During the second phase ($\phi_2$), the input voltage $V_{in}$ (typically about 10 mV) is amplified to produce the corresponding output voltage $V_{out}$ (typically about 100 mV). In an ideal switched-capacitor amplifier, the output voltage, $V_{out}$, is directly proportional to the input voltage, $V_{in}$, with a gain of $C_{in}/C_f$.

The amplifier circuitry 90 includes switches 106, 110, and 114, which are clocked by the two phase clock signal. The switches 106, 110, and 114 are typically implemented using FETs. The poles of the switches 106, 110, and 114 are labelled with the corresponding phase ("PH1" or "PH2") during which the switch is connected to that pole. For example, the upper pole of switch 106 is labelled "PH1" to indicate that the switch 106 couples the input capacitor $C_{in}$ 102 to ground during the first phase. The lower pole of switch 106 is labelled "PH2" to indicate that the switch 106 is connected to $V_{in}$ during the second phase. The switch 110 couples the feedback capacitor $C_f$ 104 to ground during the first phase and couples the feedback capacitor $C_f$ 104 to the output of the operational amplifier 100 during the second phase. The switch 114 couples the output of the operational amplifier 100 to its inverting input node (−) during the first phase.

With the output of the operational amplifier 100 connected to the inverting input node during the first phase, the voltage at the output (and thus the inverting input node) approaches $V_{os}$ (typically about 5 mV). The voltage, $V_{os}$, shown in FIG. 1 is the "offset voltage" of amplifier 100. During the first phase, the capacitors $C_{in}$ 102 and $C_f$ 104 are initialized to the offset voltage. Thus, during the end of the first phase, $$Q_{Cin\phi 1} = -V_{os} * C_{in} \qquad (1)$$

$$Q_{Cf\phi 1} = -V_{os} * C_f \qquad (2)$$

where $Q_{Cin}$ = charge stored on $C_{in}$ $Q_{Cf}$ = charged stored on $C_f$

At the onset of second phase, the input to the amplifier circuitry 90 is connected to $V_{in}$, the voltage to be amplified. Because the output node of the amplifier 100 is connected to the inverting input of the amplifier 100 via the feedback capacitor 104, feedback maintains the voltage at the inverting input node of the amplifier 100 at $V_{os}$. Accordingly, the voltage across capacitor $C_{in}$ is $(V_{in}-V_{os})$ and the charge on $C_{in}$ is:

$$Q_{Cin\phi 2} = (Vin-V_{os}) * C_{in} \qquad (3)$$

In addition, the switch 114 is opened at the end of the first phase. Because the switch 114 is an FET switch, it is characterized by a gate-channel capacitance. When the input voltage at the gate of the FET is changed to open the switch 114, a charge $Q_{114}$ from the gate-channel capacitance is injected onto the inverting input node of the operational amplifier 100. During the second phase, the voltage at the output terminal of the amplifier 100 adjusts to accommodate the conditions imposed by the remainder of the system. The voltage $(V_{out}-V_{os})$ across the feedback capacitor $C_f$ 104, adjusts during the second phase, so that the voltage conditions imposed by the input voltage $V_{in}$ at the input to the amplifier circuitry 90 and the offset voltage $V_{os}$ due to the feedback condition at the inverting node are accommodated. The injected charge $Q_{114}$ is also accommodated by the fluctuating voltage across the capacitor $C_f$ 104. Accordingly, during the end of the second phase:

$$Q_{cf\phi 2} = (V_{out}-V_{os}) * C_f + Q_{114} \qquad (4)$$

where $Q_{114}$ is the charge injected by the opening of the switch 114.

Due to the law of conservation of charge:

$$(Q_{cin\phi 2}+Q_{cf\phi 2})-(Q_{cin\phi 1}+Q_{cf\phi 1})=0 \qquad (5)$$

Substituting Equations 1–4 into Equation 5 and solving for $V_{out}$ results in the relationship of Equation 6.

$$V_{out}=-V_{in}*(C_{in}/C_f)-(Q_{114}/C_f) \qquad (6)$$

As shown by Equation 6, the output voltage of the amplifier circuitry 90 is not directly affected by the offset voltage $V_{os}$. However, there is a nonideal term $(Q_{114}/C_f)$ due to charge injection by the switch 114, which reduces the accuracy of the amplifier.

The effects of charge injection can be reduced somewhat by using a large value for the feedback capacitor $C_f$ 104. However, large capacitors are generally undesirable, because they occupy a large area on the integrated circuit. Further, if $C_f$ is increased, then $C_{in}$ must be increased to maintain a given gain.

In accordance with the present invention, circuitry is provided for compensating for the offset voltage of a switched-capacitor amplifier while avoiding the effects of charge injection exhibited by conventional offset compensation circuits. As shown in FIG. 2, amplifier circuitry 201 of the present invention includes an operational amplifier 200, an input capacitor $C_{in}$ 202 and a feedback capacitor $C_f$ 204. However, unlike conventional arrangements, the switches of the amplifier circuitry 201 are clocked by a three phase clock signal, which is illustrated in FIG. 3. As shown in FIG. 3, the three phase clock preferably includes non-overlapping clock phases $\phi_2$ and $\phi_3$, and a short clock phase $\phi_1$. During the first phase, the voltage offset of the amplifier 200 is compensated by connecting the output of the amplifier 200 to its inverting input node. At the end of the first phase, this connection is broken, which results in the injection of charge onto the inverting input node. For the remainder of the second phase, the charge injected onto the inverting input node is removed, thereby eliminating the effects of charge injection. During the third phase, the input voltage $V_{in}$ is amplified to produce the output voltage $V_{out}$.

Preferably, phases $\phi_1$ and $\phi_2$ go active at the same time. Phase $\phi_1$ goes inactive before phase $\phi_2$ goes inactive. Phase $\phi_3$ goes active after phase $\phi_2$ has gone inactive.

The switches shown in FIG. 2 are preferably implemented using FETs. The amplifier circuitry 201 includes a switch 206 which couples the input capacitor $C_{in}$ 202 to ground during the second phase. The switch 206 couples the input capacitor $C_{in}$ 202 to an input voltage $V_{in}$ during the third phase. A switch 210 couples the feedback capacitor $C_f$ 204 to ground during the second phase and couples the feedback capacitor $C_f$ 204 to the output of the operational amplifier 200 during the third phase. A switch 214 couples the output of the operational amplifier 200 to its inverting input during the first phase.

The amplifier circuitry 201 includes a charge reduction circuit 216. The purpose of the charge reduction circuit 216 is to reduce the charge that is injected onto the inverting input node of the amplifier 200 by the switch 214. The charge reduction circuit 216 provides a feedback path that allows the voltage at the inverting input node of the amplifier 200 to be restored to $V_{os}$ after switch 214 opens.

The charge reduction circuit 216 has a capacitor $C_1$ 218 with one plate coupled to the inverting input of the operational amplifier 200. The other plate of $C_1$ 218 is connected to a plate of a capacitor $C_2$ 220. The other plate of $C_2$ 220 is connected to ground. A switch 222 connects the output of the operational amplifier 200 to the juncture of $C_1$ 218 and $C_2$ 220 at a node 224 during the second phase. The switch 222 disconnects the circuit 216 from the amplifier output during the third phase, so that the circuit 216 does not affect the amplifier gain while the input voltage signal is being amplified.

Those skilled in the art will understand that each connection to ground described herein may instead be made to a corresponding reference voltage, without loss of generality.

The capacitor $C_1$ 218 accepts charge from the inverting node of the amplifier 200 during the end of the second phase. Preferably, $C_1$ is sufficiently large to remove all of the charge injected onto the inverting node ($Q_{214}$) when the switch 214 is opened. The amount of charge that can be removed by the capacitor $C_1$ 218 is equal to the product of $C_1$ and the maximum value of $V_{out}$. Thus, the value of $C_1$ is preferably greater than ($Q_{214}/V_{out(max)}$).

The capacitor $C_2$ 220 is preferably large enough to maintain the voltage at the node 224 fairly constant when the switch 222 opens at the end of the second phase. $C_2$ is therefore preferably selected to be much greater than $C_1$.

The sum of the capacitances ($C_{in}+C_f$) is preferably selected to be much greater than the value of $C_1$, and $C_2$ is preferably selected to be much greater than $C_1$. With these values, the capacitors $C_1$ 218 and $C_2$ 220 will attenuate the signal due to charge injection from opening the switch 222. If an attenuation factor of ten is desired, then the sum of the capacitances ($C_{in}+C_f$) could be ten times greater than the value of $C_1$; $C_2$ should be ten times greater than $C_1$. For a gain of four and an attenuation factor of at least ten, typical values might be $C_{in}$=4 pF, $C_f$=1 pF, $C_1$=0.1 pF, and $C_2$=4 pF.

A flowchart of the steps involved in the operation of the amplifier circuitry 201 of FIG. 2 is shown in FIG. 4. During the first and second phases, the switch 206 couples $C_{in}$ 202 to ground, the switch 210 couples the capacitor $C_f$ 204 to ground and the switch 222 couples the operational amplifier output to the node 224. The switch 214 couples the output of the amplifier 200 to its inverting input for the duration of the first phase (step 310).

During the first phase, the capacitors $C_{in}$ 202, $C_f$ 204, and $C_2$ 220 are charged to the offset voltage $V_{os}$. As with the circuit of FIG. 1:

$$Q_{cin}=-V_{os}*C_{in} \quad (7)$$

$$Q_{cf}=-V_{os}*C_f \quad (8)$$

When the first phase ends, the switch 214 opens, causing charge to be injected into the inverting input of the operational amplifier 200 (step 312). This charge injection causes the voltage at the inverting input to change by:

$$\Delta V=Q_{214}/(C_{in}+C_f+C_1) \text{ assuming } C_1<<C_2 \quad (9)$$

where $Q_{214}$ is the charge injected by the opening of the switch 214. However, during the remaining portion of the second phase, the feedback through the switch 222 and the capacitor $C_1$ 218 restores the voltage at the inverting input node to the offset voltage $V_{os}$, thereby eliminating the effect of the charge injection $Q_{214}$ (step 314).

The opening of the switch 222 at the end of the second phase injects a charge $Q_{222}$ onto the node 224 (step 316). As a result, the voltage at the node 224 changes by approximately:

$$\Delta V_{224}=Q_{222}/(C_1+C_2) \quad (10)$$

where $Q_{222}$ is the charge injected onto node 224 by the opening of the switch 222.

However, the gain of the voltage at node 224 is:

$$G=C_1/(C_1+C_{in}+C_f) \quad (11)$$

which has the effect of attenuating the effect of $Q_{222}$ because $G<<1$ (step 318). The arrangement of $C_1$ 218 and $C_2$ 220 is referred to herein as the feedback attenuation circuit.

To determine the effect at the output, the charge, Q, injected onto the inverting input must be calculated:

$$Q = C_1 * \Delta V_{224} \quad (12)$$
$$= (C_1 * Q_{222})/(C_1 + C_2)$$

At the end of the second phase:

$$Q_{cin\phi2}=(0-V_{os})*C_{in}+Q \quad (13)$$

$$Q_{cf\phi 2}=(0-V_{os})*C_f \tag{14}$$

At the end of the third phase:

$$Q_{cin\phi 3}=(V_{in}-V_{os})*C_{in} \tag{15}$$

$$Q_{cf\phi 3}=(V_{out}-V_{os})*C_f \tag{16}$$

Due to the law of conservation of charge:

$$Q_{cin\phi 3}+Q_{cf\phi 3}-Q_{cin\phi 2}-Q_{cf\phi 2}=0 \tag{17}$$

Substituting Equations 13–16 into Equation 17 and solving for $V_{out}$ results in:

$$V_{out}=-|V_{in}(C_{in}/C_f)+(C_1*Q_{222})/(C_f*(C_1+C_2))| \tag{18}$$

In general, $Q_{222}=Q_{214}$ because of the uniformity of the FET switches 214 and 222. Thus, in comparing Equations 6 and 18, one can see that the charge injection effect at the output has been reduced by $C_1/(C_1+C_2)$. The charge reduction circuit 216 (FIG. 2) therefore reduces the effects of switch charge injection without requiring the use of an unacceptably large feedback capacitor.

Figure 5:
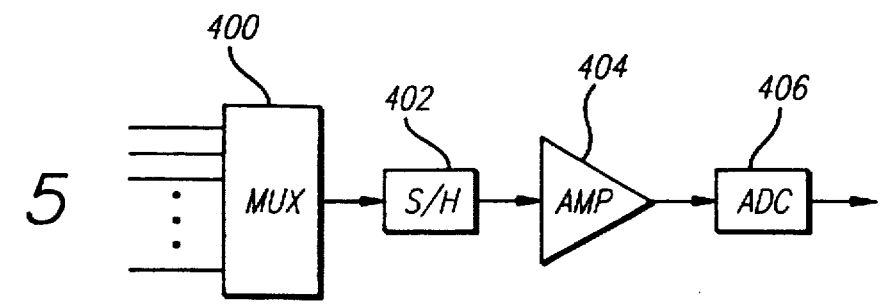
FIG. 5 illustrates a data acquisition system incorporating the switched-capacitor amplifier of the present invention.

Switched-capacitor amplifiers find use in many low power applications. FIG. 5 illustrates a switched-capacitor amplifier 404 employed as a buffer amplifier in a data acquisition system. Such a system may itself be incorporated into the measured data module of an implantable medical device, such as a pacemaker. A multiplexer 400 selects the data to be measured. Such data may include, for example, the pacemaker battery voltage or current, or electrical characteristics of the heart. The selected signal is sampled by a sample and hold circuit 402, which provides the sampled input to the switched-capacitor amplifier 404 of the present invention. The amplified analog output of the amplifier 404 is provided to an analog-to-digital converter 406 to provide a digital measured data signal that can be communicated by the pacemaker to an external programmer, or otherwise manipulated.

Figure 6:
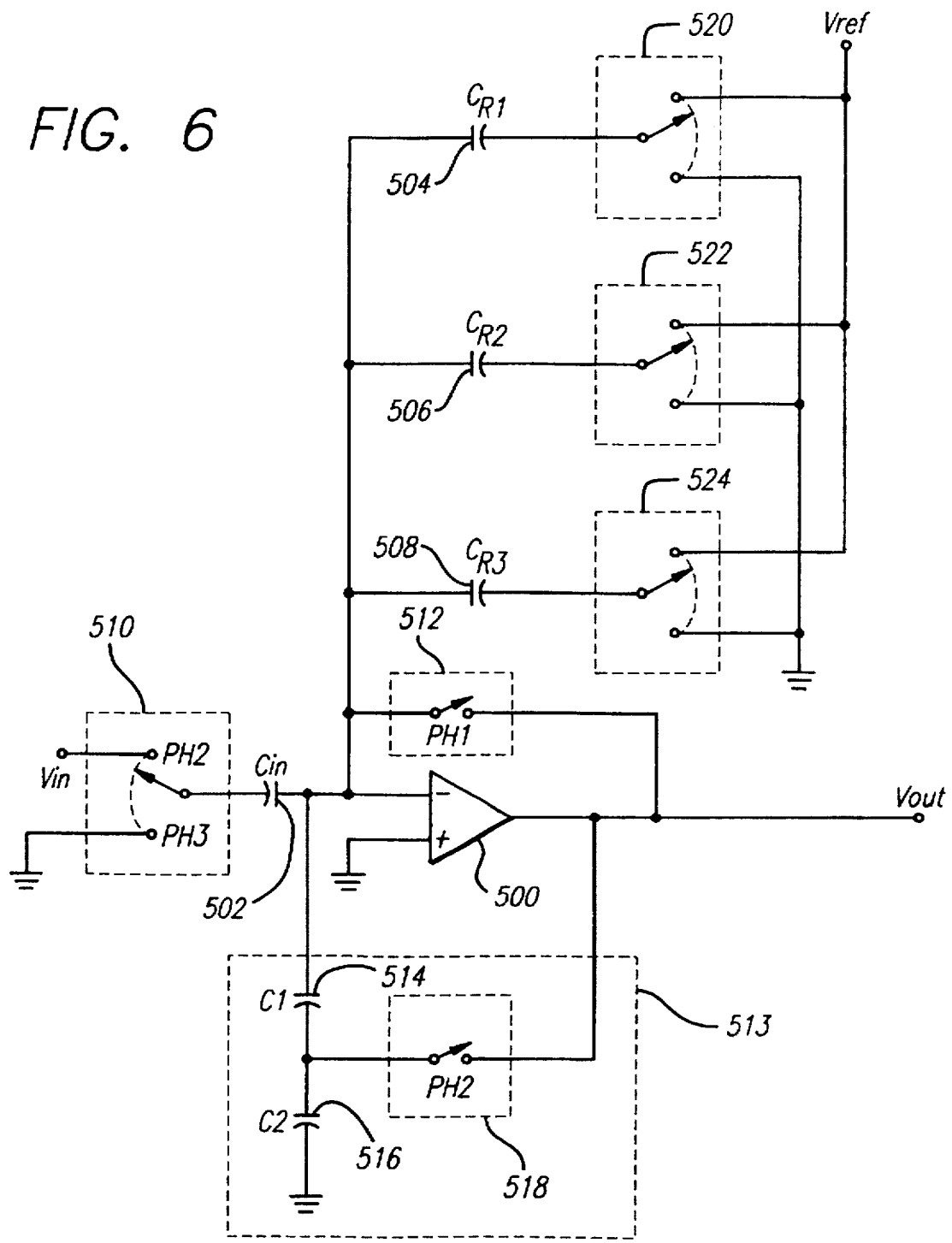
FIG. 6 illustrates an analog-to-digital converter incorporating the charge injection reduction circuit of the present invention.

FIG. 6 illustrates the charge injection reduction circuit of the present invention incorporated into a successive approximation analog-to-digital converter (ADC). The analog-to-digital converter includes an operational amplifier 500, an input capacitor $C_{in}$ 502, and three reference capacitors $C_{R1}$ 504, $C_{R2}$ 506 and $C_{R3}$ 508, each corresponding to a bit of the digital output of the analog-to-digital converter. Those skilled in the art will understand that any number of reference capacitors may be used to represent any number of bits of the digital output. The ADC includes a switch 510 that is clocked by phases 2 and 3 of the three-phase clock signal of FIG. 3. The switch 510 couples the input capacitor $C_{in}$ 502 to the input voltage $V_{in}$ during the second phase, and to ground during the third phase. A switch 512 couples the output of the operational amplifier 500 to its inverting input during the first phase.

The charge reduction circuit 513 includes a capacitor $C_1$ 514 that has one plate coupled to the inverting input of the operational amplifier 500. The other plate of $C_1$ 514 is connected to one plate of a capacitor $C_2$ 516. The other plate of $C_2$ 516 is connected to ground. A switch 518 connects the output of the operational amplifier 500 to the juncture of $C_1$ 514 and $C_2$ 516 during phase 2.

As with the circuit of FIG. 2, feedback through $C_1$ 514 and the switch 518 eliminates the effects of charge injection caused by the opening of the switch 512 at the end of phase 1. Further, the feedback gain of the feedback attenuation circuit ($C_1$ 514 and $C_2$ 516) attenuates the charge injected by the opening of the switch 518 at the end of phase 2.

Switches 520, 522 and 524 selectively couple the reference capacitors $C_{R1}$ 504, $C_{R2}$ 506 and $C_{R3}$ 508 respectively to either a reference voltage $V_{ref}$ or ground, as described below. Because the reference capacitors correspond to bits of the digital output, the capacitors are selected so that their capacitance values are related to one another by powers of two. The value of $C_{R1}$ 504 is preferably twice the value of $C_{R2}$ 506 and four times the value of $C_{R3}$ 508.

The successive approximation ADC of FIG. 6 operates as follows. Initially, the switches 520, 522 and 524 are set to ground and the switch 510 to $V_{in}$. The initialization phases, phase 1 and phase 2, are then performed. At the start of phase 3, the switch 510 is switched from $V_{in}$ to ground, and the switch 520 is switched from ground to $V_{ref}$. In this configuration, the operational amplifier 500 is essentially used as a comparator. After the switches have been switched in phase 3, the comparator is allowed to settle in response to the switching.

The comparator output is determined by Equation 19:

IF $C_{in}*V_{in}>C_{R1}*V_{ref}$

THEN $V_{o1}=1$  (19)

ELSE $V_{o1}=0$ where $V_{o1}$ is the output of the comparator in this step, and represents the most significant bit of the digital output. If $V_{o1}$ is high (1) then the switch 520 remains connected to $V_{ref}$. Otherwise, the switch 520 is switched back to ground.

To determine the next bit, $V_{o2}$, the switch 522 is connected to $V_{ref}$ and the comparator is allowed time to settle. The comparator output is determined by the Equation 20:

IF $C_{in}*V_{in}>V_{o1}*C_{R1}*V_{ref}+C_{R2}*V_{ref}$

THEN $V_{o2}=1$  (20)

ELSE $V_{o2}=0$

If $V_{o2}$ is high (=1), then the switch 522 remains connected to $V_{ref}$, otherwise the switch 522 is switched back to ground.

To determine the least significant bit, $V_{o3}$, the switch 524 is connected to $V_{ref}$. The comparator output is given by Equation 21:

IF $C_{in}*V_{in}>11$ $V_{o1}*C_{R1}*V_{ref}+V_{o2}*C_{R2}*V_{ref}$

THEN $V_{o3}=1$  (21)

ELSE $V_{o3}=0$

By equating charges, the input voltage is:

$$V_{in}=(V_{ref}/C_{in})*(V_{o1}*C_{R1}+V_{o2}*C_{R2}+V_{o3}*C_{R3}) \tag{22}$$

The use of the charge injection reduction circuit in an analog-to-digital converter illustrates the versatility of the circuit. The charge injection reduction circuit may be employed in any application that incorporates a switched-capacitor amplifier, including comparators (as inherently shown in its use in an ADC) and digital-to-analog converters, as well as ADCs and straight amplifier applications.

Figure 7:
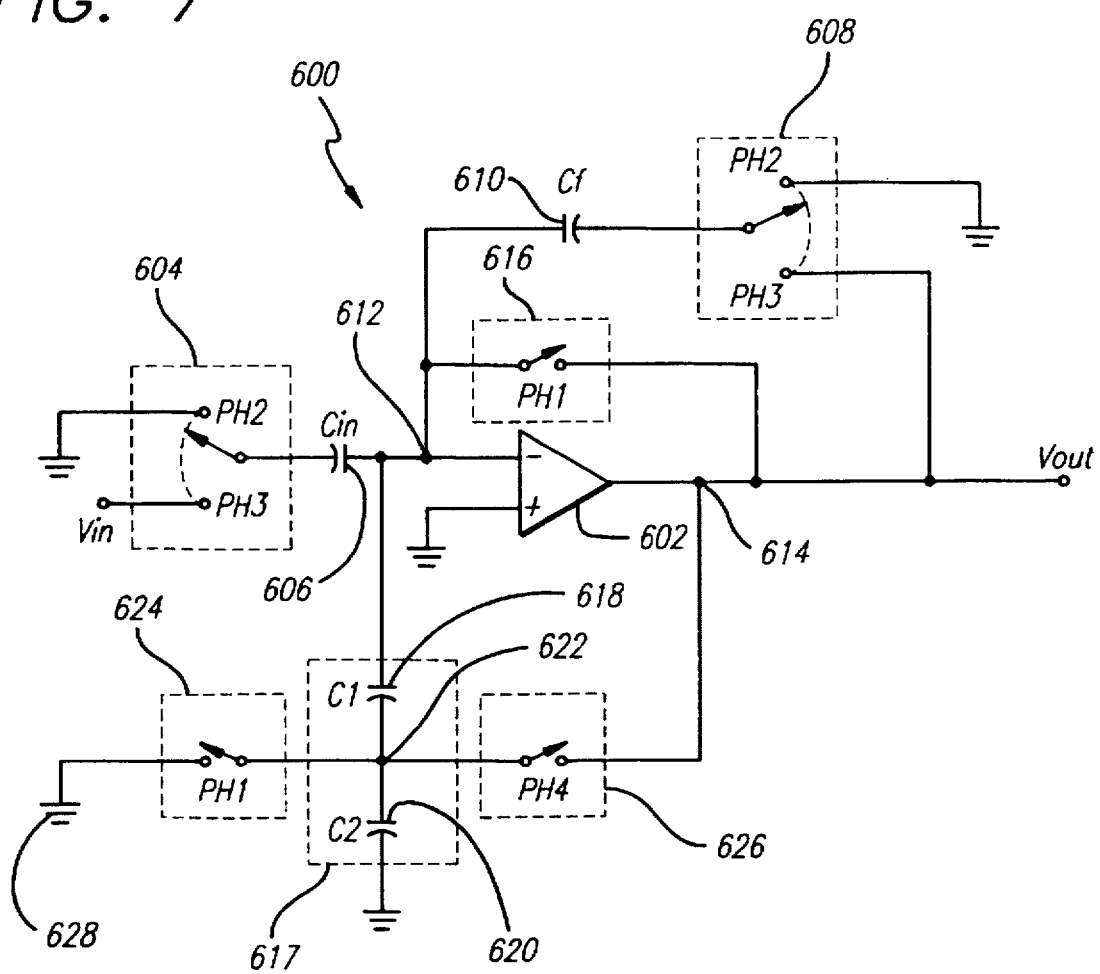
FIG. 7 is a circuit diagram of a further illustrative embodiment of the switched-capacitor amplifier circuitry of the present invention.
Figure 8:
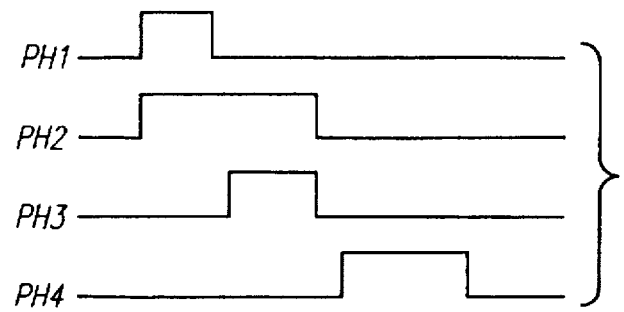
FIG. 8 is a diagram of an illustrative four phase clock signal for clocking the circuitry of FIG. 7.
Figure 9:
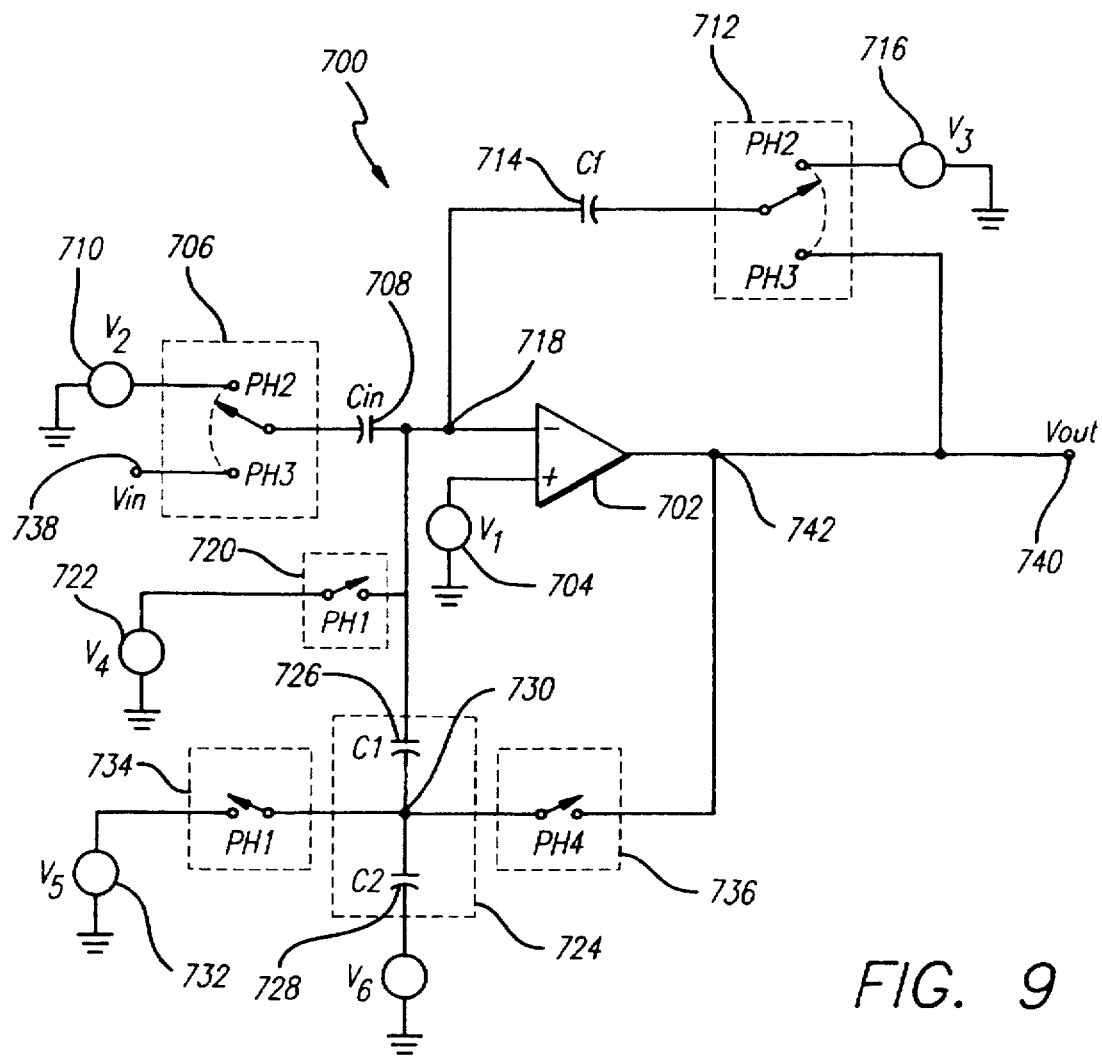
FIG. 9 is a circuit diagram of an additional illustrative embodiment of the switched-capacitor amplifier circuitry of the present invention, which is also clocked by the four phase clock signal of FIG. 8.

Additional offset voltage compensation circuits in accordance with the present invention are shown in FIGS. 7–9. The switched-capacitor amplifier circuitry 600 of FIG. 7 is based on an operational amplifier 602. The switched-capacitor amplifier circuitry 600 is preferably clocked by a four-phase clock signal shown in FIG. 8. During the first, second, and fourth phases, the switched-capacitor amplifier 600 is initialized. During the third phase, the input voltage $V_{in}$ is amplified to generate a corresponding output voltage $V_{out}$.

Preferably, the first and second phases begin simultaneously. During the first and second phases, an input switch 604 connects a capacitor $C_{in}$ 606 to ground and a switch 608 connects a capacitor $C_f$ 610 to ground. A node 612 common to the capacitors $C_{in}$ 606 and $C_f$ 610 is connected to the output 614 of the amplifier 602 by a switch 616. This connection establishes a feedback connection between the output 614 and the inverting input of the amplifier 602 such that node 612 attains the offset voltage $V_{os}$.

The switched-capacitor amplifier circuitry 600 also has a feedback attenuation circuit 617 including a capacitor $C_1$ 618 and a capacitor $C_2$ 620. During the first phase, when the node 612 is being maintained at $V_{os}$, a node 622 between the capacitors $C_1$ 618 and $C_2$ 620 is connected to a ground potential by a switch 624.

At the end of the first phase, the switch 624 is opened. The node 612 is at $V_{os}$ and the node 622 is at ground, which is close to $V_{os}$. "Close," as used herein refers to a voltage level preferably within approximately a few percent of the desired voltage level. Because the node 622 is initialized to a value that is close to the offset voltage at the node 612, the charge injected onto the node 612 when the switch 616 is opened can be removed by the capacitor $C_1$ 618. This is accomplished during the fourth phase, in which a switch 626 is closed, thereby coupling the output node 614 to the node 612 via the capacitor $C_1$ 618. The attenuation circuit 617 attenuates the effect of the voltage change due to the charge injected onto the node 622 when the switch 626 is opened.

In the arrangement of FIG. 2, the amplifier output is used to initialize the node 224 to the voltage $V_{os}$, so that subsequently the injected charge at the inverting input can be reduced by the capacitor 218. The circuit arrangement of FIG. 7 uses a separate source of potential (a ground potential 628) to initialize the voltage on the node 622 to a value close to the offset voltage on the node 612. As a result, the output node 614 is exposed to a lower capacitance during the first phase than the output node in the arrangement of FIG. 2. The lower capacitance experienced by the output node 614 of the switched-capacitor amplifier circuitry 600 allows the output node 614 to settle more quickly, exhibit less ringing, and experience a lower current drain than the arrangement of FIG. 2.

Additional switched-capacitor amplifier circuitry 700 based on an operational amplifier 702 is shown in FIG. 9. The switched-capacitor amplifier circuitry 700 is clocked by the four-phase clock signal shown in FIG. 8. During the first, second, and fourth phases, the switched-capacitor amplifier 700 is initialized. During the third phase, the input voltage $V_{in}$ is amplified to generate a corresponding output voltage $V_{out}$.

A number of reference potentials are used in the switched-capacitor amplifier circuitry 700 of FIG. 9. For example, the non-inverting input of the operational amplifier 702 is connected to a first reference potential 704. Suitable reference potentials include ground and non-ground fixed potentials. Similar reference potentials can be used in the circuit arrangements of FIGS. 2–8.

Preferably, the first and second clock phases of FIG. 8 begin simultaneously. As shown in FIG. 9, during the first and second phases, an input switch 706 connects a capacitor $C_{in}$ 708 to a second reference potential 710. A switch 712 connects a capacitor $C_f$ 714 to a third reference potential 716. A node 718 is common to the capacitors $C_{in}$ 708 and $C_f$ 714. A switch 720 couples a fourth reference potential 722 to the node 718. The magnitude of the fourth reference potential is approximately equal to the magnitude of the first reference potential. Applying the fourth reference potential to the node 718 therefore initializes the node 718 so that the voltage across the inverting and noninverting terminals of the operational amplifier 702 is close to the offset voltage of the operational amplifier 702 (e.g., close to zero).

The switched-capacitor amplifier circuitry 700 has a feedback attenuation circuit 724 including a capacitor $C_1$ 726 and a capacitor $C_2$ 728. During the first phase, when the node 718 is being maintained at a voltage close to the offset voltage of the operational amplifier 702 relative to the noninverting input, a node 730 between the capacitors $C_1$ 726 and $C_2$ 728 is connected to a fifth potential 732 by a switch 734.

At the end of the first phase, the switches 720 and 734 are opened. The node 718 is at the fourth potential, which is close to the offset voltage of the operational amplifier 702 relative to the noninverting input. In order to complete the initialization of the node 718, a switch 736 is closed for the fourth phase. With the switch 736 closed, a feedback path is formed. The feedback path arrangement of FIG. 9 allows the capacitor $C_1$ 726 to absorb or supply the charge necessary to maintain the node 718 at the offset voltage of the operational amplifier 702.

At the end of the fourth phase, the switch 736 is opened, which results in the injection of charge onto node 730. However, the attenuation circuit 724 attenuates the effect of the injected charge, so that the voltage at the node 718 is undisturbed by the opening of the switch 736. In the third phase, the switch 706 couples an input terminal 738 to the capacitor $C_{in}$ 708. The switch 712 connects the capacitor $C_f$ 714 to an output terminal 740. During the third phase, the switched-capacitor amplifier circuitry 700 amplifies the voltage at the input terminal 738 and delivers a corresponding amplified output voltage to the output terminal 740.

In the arrangement of FIG. 2, the amplifier output is used to initialize the node 224 to the voltage $V_{os}$, so that subsequently the injected charge at the inverting input can be reduced by the capacitor 218. The circuit arrangement of FIG. 9 uses a separate source of potential (the fifth potential 732) to initialize the voltage on the node 730 to a value close to the voltage on the node 718. As a result, output node 742 is exposed to a lower capacitance during the first phase than the comparable output node in the arrangement of FIG. 2. The lower capacitance experienced by the output node 742 of the switched-capacitor amplifier circuitry 700 allows the output node 742 to settle more quickly, exhibit less ringing, and experience a lower current drain than the arrangement of FIG. 2.

It will be appreciated that various modifications and alterations might be made by those skilled in the art without departing from the spirit and scope of the present invention. The invention should, therefore, be measured in terms of the claims which follow.

What is claimed is:

1. A switched-capacitor system, comprising:
   an amplifier having an inverting input, a noninverting input and an-output, the amplifier having a first and second switched-capacitor circuit, the first switched-capacitor circuit being coupled between the inverting input and the output, the second switched-capacitor circuit being coupled between the inverting input and an input voltage, the amplifier further having an offset voltage that is required at the input of the amplifier to produce a zero level output, wherein the noninverting input is coupled to a first reference voltage;

11 capacitive feedback attenuation means, coupled to the inverting input, for attenuating charge injected into the inverting input;

means for generating a clock signal having a first and a second phase signal, the second phase signal beginning when the first phase signal begins and ending after the first phase signal ends;

first switching means for initializing the inverting input to the offset voltage during a first phase signal, wherein a first charge injection signal is injected into the inverting input at the end of the first phase signal; and second switching means for selectively coupling and uncoupling the capacitive feedback attenuation means to the amplifier output during the second phase signal which causes a second charge injection signal to be injected into the inverting input, wherein the capacitive feedback attenuation circuit restores the first charge injection signal caused by the first switching means and attenuates the second charge injection signal of the second switching means.

2. The switched-capacitor system of claim 1, wherein the capacitive feedback attenuation means comprises:

a first capacitor having a first plate and a second plate, the first plate being coupled to the inverting input of the amplifier, the second plate being coupled to a first node; and a second capacitor having a first plate and a second plate, the first plate of the second capacitor being coupled to the first node, the second plate of the second capacitor being coupled to the first reference voltage, wherein the second switching means couples the first node to the output of the amplifier during the second phase signal, and uncouples the first node from the output of the amplifier at the end of the second phase signal.

3. The switched-capacitor system of claim 2, wherein the first switching means comprises:

a switch connected between the output of the amplifier and the inverting input, the switch being closed during the first phase signal and open at the end of the first phase signal.

4. The switched-capacitor system of claim 2, wherein the first switching means comprises:

a first switch connected between the output of the amplifier and the inverting input, the first switch being closed during the first phase signal and open at the end of the first phase signal; and a second switch connected between the first node and a second reference voltage, the second switch being closed during the first phase signal and open at the end of the first phase signal.

5. The switched-capacitor system of claim 4, wherein the first and second reference voltages are at ground potential.

6. The switched-capacitor system of claim 2, wherein the first switching means comprises:

a first switch connected between the inverting input of the amplifier and a second reference voltage, the first switch being closed during the first phase signal and open at the end of the first phase signal; and a second switch connected between the first node and a third reference voltage, the second switch being closed during the first phase signal and open at the end of the first phase signal.

7. The switched-capacitor system of claim 1, wherein the first switched-capacitor circuit includes a feedback capacitor switchably coupled to one of the amplifier output or the first

12 reference voltage, and the second switched-capacitor circuit includes an input capacitor switchably coupled to one of the voltage input or the first reference voltage, further comprising:

control means for switching the feedback and the input capacitors to the first reference voltage during the second phase signal;

whereby the input and feedback capacitors are initialized to the offset voltage during the first phase signal.

8. The switched-capacitor system of claim 7, wherein the clock signal generating means includes means for generating a third phase signal beginning after the second phase signal ends, wherein the control means further comprises:

means for switching the feedback capacitor to the amplifier output during the third phase signal; and means for switching the input capacitor to the input voltage during the third phase signal;

whereby the offset voltage that is stored on the input and feedback capacitors during first phase are canceled during the third phase when the input voltage is amplified.

9. A switched-capacitor amplifier circuit, comprising:

an amplifier having an inverting input, a noninverting input and an output, wherein the noninverting input is coupled to a first voltage;

a feedback attenuation circuit coupled to the inverting input;

means for generating a clock signal having a first, a second and a third phase signal, the second phase signal beginning when the first phase signal begins and ending after the first phase signal ends, the third phase signal beginning after the second phase signal ends;

first switching means for coupling the output of the amplifier to the inverting input during the first phase signal, and for uncoupling the output of the amplifier from the inverting input at the end of the first phase signal which causes a first charge injection signal;

second switching means for coupling the feedback attenuation circuit to the amplifier output during a second phase signal, and for uncoupling the feedback attenuation circuit from the amplifier output at the end of the second phase signal which causes a second charge injection signal, wherein the feedback attenuation circuit restores the first charge injection signal and attenuates the second charge injection signal of the second switching means;

an input capacitor having a first plate and a second plate, wherein the second plate is coupled to the inverting input of the amplifier;

third switching means for coupling the first plate of the input capacitor to a second voltage during the second phase signal and to a third voltage during the third phase signal;

a feedback capacitor having a first plate and a second plate, wherein the first plate is coupled to the inverting input; and fourth switching means for coupling the second plate of the feedback capacitor to a fourth voltage during the second phase signal and to the output of the amplifier during the third phase signal.

10. The switched-capacitor amplifier of claim 9, wherein the feedback attenuation circuit comprises:

a first capacitor having a first plate and a second plate, wherein the first plate is coupled to the inverting input of the amplifier; and a second capacitor having a first plate and a second plate, wherein the first plate is coupled at a node to the second plate of the first capacitor, and the second plate of the second capacitor is coupled to a fifth voltage, wherein the second switching means couples the node to the output of the amplifier during the second phase signal, and uncouples the node from the output of the amplifier at the end of the second phase signal.

11. The switched-capacitor amplifier of claim 9, wherein the first, second, and fourth voltages are at ground potential.

12. A switched-capacitor successive approximation analog-to-digital converter, comprising:

an amplifier having an inverting input, a noninverting input and an output, wherein the noninverting input is coupled to a first voltage;

a feedback attenuation circuit coupled to the inverting input;

means for generating a clock signal having a first, a second and a third phase signal, the second phase signal beginning when the first phase signal begins and ends after the first phase signal ends, the third phase beginning after the end of the second phase;

first switching means for coupling the output of the amplifier to the inverting input during the first phase signal, and for uncoupling the output of the amplifier from the inverting input at the end of the first phase signal which causes a first charge injection signal;

second switching means for coupling the feedback attenuation circuit to the amplifier output during a second phase signal to restore the first charge injection signal, and for uncoupling the feedback attenuation circuit from the amplifier output at the end of the second phase signal which causes a second charge injection signal, wherein the feedback attenuation circuit attenuates the second charge injection signal;

an input capacitor having a first plate and a second plate, wherein the second plate is coupled to the inverting input of the amplifier;

third switching means for coupling the first plate of the input capacitor to a second voltage during the second phase signal and to a third voltage during a third phase signal, wherein the third phase signal starts after the second phase signal ends;

a plurality of parallel capacitors, each parallel capacitor having a first plate and a second plate, wherein each first plate is coupled to the inverting input; and a plurality of associated switching means, each associated switching means for selectively coupling the second plate of a corresponding parallel capacitor to either a fourth voltage or a fifth voltage.

13. The switched-capacitor system of claim 12, wherein the feedback attenuation circuit comprises:

a first capacitor having a first plate and a second plate, wherein the first plate is coupled to the inverting input of the amplifier; and a second capacitor having a first plate and a second plate, wherein the first plate is coupled at a node to the second plate of the first capacitor, and the second plate of the second capacitor is coupled to a sixth voltage, wherein the second switching means selectively couples the node to the output of the amplifier during the second phase signal, and uncouples the node from the output of the amplifier at the end of the second phase signal.

14. The switched-capacitor system of claim 12, wherein:

the plurality of parallel capacitors have capacitance values related to each other by powers of two, each parallel capacitor corresponding to a bit of a digital signal that represents a difference between the second voltage and the third voltage; and the associated switching means are switched during the third phase signal so that the switched-capacitor system acts as a successive approximation analog-to-digital converter.

15. The switched-capacitor system of claim 12, wherein:

the associated switching means is switched during the third phase signal so as to provide a threshold voltage as a function of the fourth and fifth voltages; and the difference between the second voltage and the third voltage is compared to the threshold voltage so that the switched-capacitor system acts as a comparator.

16. The switched-capacitor system of claim 12, wherein the first, third, and fifth voltages are at ground potential.

17. In a switched-capacitor system including an amplifier and first switching means for selectively coupling an output of the amplifier to an inverting input of the amplifier, a method for reducing charge injection signals comprising the steps of:

(a) generating a first and second phase signal of a clock signal, wherein the second phase signal begins with the first phase signal and ends after the first phase signal ends;

(b) coupling the amplifier output to the inverting input during the first phase signal;

(c) uncoupling the amplifier output from the inverting input at the end of the first phase signal, thereby causing a first charge injection signal;

(d) coupling the inverting input to the amplifier output through a feedback attenuation circuit during the second phase signal to restore the first charge injection signal of step (c);

(e) uncoupling the feedback attenuation circuit from the amplifier output at the end of the second phase signal, thereby causing a second charge injection signal; and (f) attenuating the second charge injection signal of step (e) at the inverting input.

18. The method of claim 17, wherein the feedback attenuation circuit includes a first and a second capacitor, the first capacitor having a first plate and a second plate, the first plate being coupled to the inverting input of the amplifier, the second capacitor having a third plate and a fourth plate, wherein the third plate is coupled at a node to the second plate of the first capacitor, and the fourth plate of the second capacitor is coupled to a first voltage, wherein:

step (d) comprises the step of coupling the node to the output of the amplifier during the second phase signal; and step (e) comprises the step of uncoupling the node from the output of the amplifier at the end of the second phase signal.

19. The method of claim 18, wherein the first voltage and a voltage at a noninverting input of the amplifier are at ground potential.

20. The method of claim 17, the system further including an input capacitor having a first plate and a second plate, wherein the second plate is coupled to the inverting input of the amplifier, the method further comprising the steps of:

generating a third phase signal which begins after the second phase signal ends;

coupling the first plate of the input capacitor to a second voltage during the second phase signal; and coupling the first plate to a third voltage during the third phase signal.

21. The method of claim 20, the system further including a feedback capacitor having a first plate and a second plate, wherein the first plate is coupled to the inverting input, the method further comprising the steps of:

coupling the second plate of the feedback capacitor to a fourth voltage during the second phase signal; and coupling the second plate of the feedback capacitor to the output of the amplifier during the third phase signal.

22. The method of claim 20, wherein the switched-capacitor system further includes a plurality of parallel capacitors, each parallel capacitor having a first plate and a second plate, wherein each first plate is coupled to the inverting input, the method further comprising the step of:

selectively coupling the second plate of a corresponding parallel capacitor to either a fourth voltage or a fifth voltage.

23. The method of claim 22, wherein the parallel capacitors have capacitance values related to each other by powers of two, each parallel capacitor corresponding to a bit of a digital signal that represents a difference between the second voltage and the third voltage, the method further comprising the step of:

selectively coupling the second plate of the corresponding parallel capacitor to either a fourth voltage or a fifth voltage during the third phase signal so that the switched-capacitor system acts as a successive approximation analog-to-digital converter.

24. The method of claim 22, wherein:

the second plates of selected parallel capacitors are switched during the third phase signal so as to provide a threshold voltage as a function of the fourth and fifth voltages; and the difference between the second voltage and the third voltage is compared to the threshold voltage so that the switched-capacitor system acts as a comparator.

25. Switched-capacitor amplifier circuitry, comprising:

an amplifier having an inverting input, a noninverting input, and an output, the amplifier having an offset voltage, the amplifier circuit further having a feedback capacitor switchably coupled between the output and the inverting input, and an input capacitor switchably coupled to the inverting input;

means for generating a clock signal having a first and a second phase signal, the second phase signal beginning when the first phase signal begins and ending after the first phase signal ends;

first initialization means for placing the inverting input at a voltage level close to the offset voltage relative to the noninverting input during the first clock phase;

second initialization means for providing a feedback path from the output of the amplifier to the inverting input of the amplifier during the second clock phase after the inverting input is placed at the voltage level close to the offset voltage relative to the noninverting input, the second initialization means causing the inverting input of the amplifier to attain a voltage level of the offset voltage relative to the noninverting input;

a feedback switch contained within the second initialization means for breaking the feedback path by opening after the second initialization means causes the inverting input of the amplifier to attain the offset voltage relative to the noninverting input; and a feedback attenuation circuit coupled to the second initialization means, the feedback switch injecting charge into the feedback attenuation circuit when the feedback switch opens, the feedback attenuation circuit attenuating voltage changes due to the feedback switch injecting charge, the feedback attenuation circuit causing the inverting input to remain at substantially the offset voltage relative to the noninverting node after the feedback path is broken.

26. The switched-capacitor amplifier circuitry of claim 25, wherein the first initialization means comprises an initialization switch connected between the output of the amplifier and the inverting input of the amplifier.

27. The switched-capacitor amplifier circuitry of claim 25, wherein the first initialization means comprises:

a voltage source; and an initialization switch connected between the voltage source and the inverting input.

28. A method of compensating for an amplifier offset voltage in a switched-capacitor amplifier circuit having an amplifier with an inverting input, a noninverting input, and an output, the switched-capacitor amplifier circuit having feedback attenuation circuitry coupled to the inverting input, the method comprising the steps of:

generating a clock signal having a first and a second phase signal, the second phase signal beginning when the first phase signal begins and ending after the first phase signal ends;

placing the inverting input at a voltage level close to the offset voltage relative to the noninverting input during the first clock phase;

causing the inverting input of the amplifier to attain a voltage level of the offset voltage relative to the noninverting input by providing a feedback path from the output of the amplifier to the inverting input of the amplifier during the second clock phase after the inverting input is placed at the voltage level close to the offset voltage relative to the noninverting input;

breaking the feedback path at the end of the second first clock phase, wherein a charge in injected into the feedback attenuation circuit; and attenuating voltage changes on the inverting input due to the step of injecting charge to cause the inverting input to remain at substantially the offset voltage relative to the noninverting node after the feedback path is broken.

29. The method of claim 28, wherein the step of placing the inverting input at a voltage level close to the offset voltage relative to the noninverting input comprises the steps of:

providing an initialization switch between the output of the amplifier and the inverting input of the amplifier; and closing the initialization switch to connect the output of the amplifier to the inverting input.

30. The method of claim 28, wherein the step of placing the inverting input at a voltage level close to the offset voltage relative to the noninverting input comprises the steps of:

providing a voltage source;

providing an initialization switch between the voltage source and the inverting input of the amplifier; and closing the initialization switch to connect the voltage source to the inverting input.

31. A switched-capacitor system, comprising:

an amplifier having an inverting input, a noninverting input and an output, the amplifier having a plurality of parallel capacitors, each parallel capacitor being coupled at one end to the inverting input and switchably coupled at a respective opposite end to either a first reference voltage or a second reference voltage, the amplifier having an input capacitor switchably coupled to the inverting input, the amplifier further having an offset voltage that is required at the input of the amplifier to produce a zero level output, wherein the noninverting input is coupled to the first reference voltage;

capacitive feedback attenuation means for attenuating charge injected into the inverting input;

means for generating a clock signal having a first and a second phase signal, the second phase signal beginning when the first phase signal begins and ending after the first phase signal ends;

first switching means for initializing the inverting input to the offset voltage during a first phase signal, wherein a first charge injection signal is injected into the inverting input at the end of the first phase signal; and second switching means for selectively coupling and uncoupling the capacitive feedback attenuation means to the amplifier output during the second phase signal which causes a second charge injection signal to be injected into the inverting input, wherein the capacitive feedback attenuation circuit restores the first charge injection signal caused by the first switching means and attenuates the second charge injection signal of the second switching means.

32. The switched-capacitor system of claim 31, wherein:

the plurality of parallel capacitors have capacitance values related to each other by powers of two, each parallel capacitor corresponding to a bit of a digital signal that represents a difference between the second reference voltage and the input voltage; and each parallel capacitor is switchably coupled to one of the first or second reference voltages during the third phase signal so that the switched-capacitor system acts as a successive approximation analog-to-digital converter.

33. The switched-capacitor system of claim 31, wherein:

the plurality of parallel capacitors are switched during the third phase signal so as to provide a threshold voltage as a function of the first or second reference voltages; and the difference between the first reference voltage and the input voltage is compared to the threshold voltage so that the switched-capacitor system acts as a comparator.

* * * * *